(12) United States Patent
Kanda et al.

(10) Patent No.: US 7,732,880 B2
(45) Date of Patent: Jun. 8, 2010

(54) SEMICONDUCTOR DEVICE AND METHOD OF MANUFACTURING THE SAME

(75) Inventors: Ryo Kanda, Gunma (JP); Iwao Takahashi, Gunma (JP); Yoshinori Sato, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 245 days.

(21) Appl. No.: 11/770,306

(22) Filed: Jun. 28, 2007

(65) Prior Publication Data

US 2008/0001238 A1 Jan. 3, 2008

(30) Foreign Application Priority Data

Jun. 29, 2006 (JP) ............................. 2006-179388

(51) Int. Cl.
*H01L 29/76* (2006.01)
(52) U.S. Cl. ............................. 257/413; 257/E21.409; 257/E29.226
(58) Field of Classification Search ............... 257/413, 257/E21.409, E29, 226
See application file for complete search history.

(56) References Cited

U.S. PATENT DOCUMENTS 7,288,816 B2 * 10/2007 Kanda et al. ................ 257/343

FOREIGN PATENT DOCUMENTS

| JP | 2003-309258 | 10/2003 |
| JP | 2003-324159 | 11/2003 |

* cited by examiner

*Primary Examiner*—Roy K Potter
(74) *Attorney, Agent, or Firm*—Fish & Richardson P.C.

(57) ABSTRACT

A conventional semiconductor device, for example, a MOS transistor including an offset gate structure has a problem that it is difficult to reduce the device size. In a semiconductor device according to the present invention, for example, in a P-channel MOS transistor including an offset gate structure, a LOCOS oxide film is formed between a source region and a drain region in an N type epitaxial layer. A gate electrode is formed to be positioned on the LOCOS oxide layer. In addition, a P type diffusion layer as the drain region and a P type diffusion layer as the source region are formed with a high positional accuracy with respect to the gate electrode. This structure makes it possible to reduce the device size of the MOS transistor.

3 Claims, 10 Drawing Sheets

SEMICONDUCTOR DEVICE AND METHOD OF MANUFACTURING THE SAME

Priority is claimed to Japanese Patent Application Number JP2006-179388 filed on Jun. 29, 2006, the content of which is incorporated herein by reference in its entirety.

BACKGROUND OF THE INVENTION

1. Field of the Invention

The present invention relates to a semiconductor device capable of reducing the device size of a transistor including an offset gate structure, and also relates to a method of manufacturing the semiconductor device.

2. Description of the Related Art

As an example of a conventional method of manufacturing a semiconductor device, the following method of manufacturing an N-channel MOS transistor has been known. Firstly, an N type epitaxial layer is stacked on a P type single crystal silicon substrate. A first silicon oxide film is formed in a portion where a bird's beak with a smooth slope is to be formed in a region of the epitaxial layer where a LOCOS oxide film is to be formed. Then, a second silicon oxide film is formed on the epitaxial layer including the portion of the first silicon oxide film. Thereafter, a silicon nitride film is formed, which includes an opening in a region where the LOCOS oxide film is to be formed. Subsequently, the LOCOS oxide film is formed by means of a LOCOS method. A photoresist is formed on the epitaxial layer as a selection mask, and a P type diffusion layer constituting a drain region is formed by means of an ion implantation technique. At this time, ions of impurity are implanted into a portion below the bird's beak with a smooth slope of the LOCOS oxide film, so that a P type diffusion layer is formed. After that, a back gate region, a source region, a gate oxide film and a gate electrode are formed. As a result, the N-channel MOS transistor is manufactured. This technology is described for instance in Japanese Patent Application Publication No. 2003-309258 (Pages 5 and 6, and FIGS. 5 to 8).

As an example of a conventional semiconductor device, the following LOCOS offset P-channel MOS transistor has been known. In a region where the P-channel MOS transistor is to be formed, an N type well region, which is to be used as a back gate region, is formed in a P type substrate by mean of an ion implantation technique using a resist mask. Then, a P type low-concentration diffusion layer, which is to be used as a drain region, is formed in the N type well region by means of the ion implantation technique using a resist mask. Thereafter, a LOCOS oxide film is formed by means of a LOCOS method in the P type substrate, and then a gate oxide film and a gate electrode are formed on the P type substrate. Subsequently, P type high-concentration diffusion layers, which are to be used as a source region and a drain region, are formed in the P type substrate by means of the ion implantation technique using a resist mask. As a result, the P-channel MOS transistor is manufactured. This technology is described for instance in Japanese Patent Application Publication No. 2003-324159 (pages 26 to 30, and FIGS. 1 to 3).

When a LOCOS offset MOS transistor is manufactured with the conventional method of manufacturing a semiconductor device, the step of forming a diffusion layer as a drain region is performed before the step of forming a gate electrode, as described above. In other words, the diffusion layer as the drain region is formed by means of the ion implantation technique using a photoresist mask in which an opening is selectively formed. Accordingly, in the case of this manufacturing method, it is necessary to take account of mask misalignment in the step of forming the diffusion layer as the drain region. For this reason, it is difficult to reduce a device size.

Moreover, in the conventional method of manufacturing a semiconductor device, the diffusion layer as the drain region is formed by means of the ion implantation technique using the photoresist mask in which the opening is selectively formed. Then, the gate electrode is formed by using the photoresist mask in which the opening is selectively formed. In this manufacturing method, mask misalignment occurs in each step, leading to a reduction in the channel length. For this reason, it is difficult to obtain desired MOS transistor characteristics. Moreover, in order to avoid the reduction in the channel length, a margin needs to be provided for the mask misalignment, in turn making it difficult to reduce the device size of the MOS transistor, as described above.

Furthermore, in the conventional method of manufacturing a semiconductor device, the diffusion layers as the drain region and the source region are formed by means of the ion implantation technique using the photoresist mask in which the opening is selectively formed. When the drain region is formed on each side of the source region, a mask misalignment produces a longer separation distance between the drain and source regions on one side while producing a shorter separation distance between the drain and source regions on the other side. For this reason, even such a reduced separation distance between the drain and source regions needs to have a desired separation distance therebetween. Accordingly, it is necessary to take account of an extra margin for mask misalignment. As a result, there is a problem that it is difficult to reduce the device size of a MOS transistor, and also to reduce the on-resistance of the MOS transistor.

SUMMARY OF THE INVENTION

The present invention has been made in consideration of the above-described circumstances. A semiconductor device according to the present invention includes as follows. Specifically, the semiconductor device includes a semiconductor layer, a drain region, a source region and a back gate region, which are formed in the semiconductor layer, a gate oxide film formed on the semiconductor layer, and a gate electrode formed on the gate oxide film. In the semiconductor device, a separation distance between the drain region and the source region is uniform below a region where the gate electrode is formed. Accordingly, in the semiconductor device according to the present invention, the source region and the drain region are formed in accordance with the region where the gate electrode is formed. This structure makes it possible to reduce the device size without deteriorating the MOS transistor characteristics.

In addition, the semiconductor device according to the present invention includes that the gate electrode is formed of a polysilicon film and a tungsten silicon film, and that the tungsten silicon film has a thickness greater than that of the polysilicon film. Accordingly, in the semiconductor device according to the present invention, the tungsten silicon film is used for the gate electrode. This structure makes it possible to suppress a level difference in an insulating layer formed on the gate electrode. As a result, a finer design rule of a wiring layer can be achieved.

Moreover, a method of manufacturing a semiconductor device according to the present invention includes the steps of forming a first diffusion layer constituting part of a drain region in a semiconductor layer, and forming a thermal oxide film in the semiconductor layer, forming a gate oxide film on the semiconductor layer, forming a gate electrode in a manner that at least part of the gate electrode is disposed on the thermal oxide film, and then forming a back gate region in a manner that the back gate region overlaps the first diffusion layer, and forming a second diffusion layer, which constitutes part of the drain region, by self-alignment using the gate electrode in a manner that the second diffusion layer overlaps the first diffusion layer, and forming a source region in a manner that the source region overlaps the back gate region. Accordingly, in the manufacturing method according to the present invention, the diffusion layer as the drain region is formed by self-alignment using the gate electrode. This manufacturing method makes it possible to form the diffusion layer as the drain region with a high positional accuracy with respect to the gate electrode. As a result, the device size of a MOS transistor can be reduced.

In addition, the method of manufacturing a semiconductor device according to the present invention includes the step of forming the source region, a side surface side of the source region facing the second diffusion layer is formed by self-alignment using the gate electrode. Accordingly, in the manufacturing method according to the present invention, it is possible to form the source region and the drain region with a high positional accuracy with respect to the gate electrode. This manufacturing method makes it possible to reduce the device size of the MOS transistor.

Moreover, the method of manufacturing a semiconductor device according to the present invention includes the step of forming the gate electrode, a tungsten silicon film is deposited on a polysilicon film, so that the tungsten silicon film has a thickness greater than that of the polysilicon film. Accordingly, in the manufacturing method according to the present invention, the gate electrode is formed by using the tungsten silicon film. This manufacturing method makes it possible to suppress the thickness of the gate electrode within a desired range. As a result, a finer design rule for forming the wiring layer can be achieved.

DETAILED DESCRIPTION OF THE PREFERRED EMBODIMENTS

Figure 1:
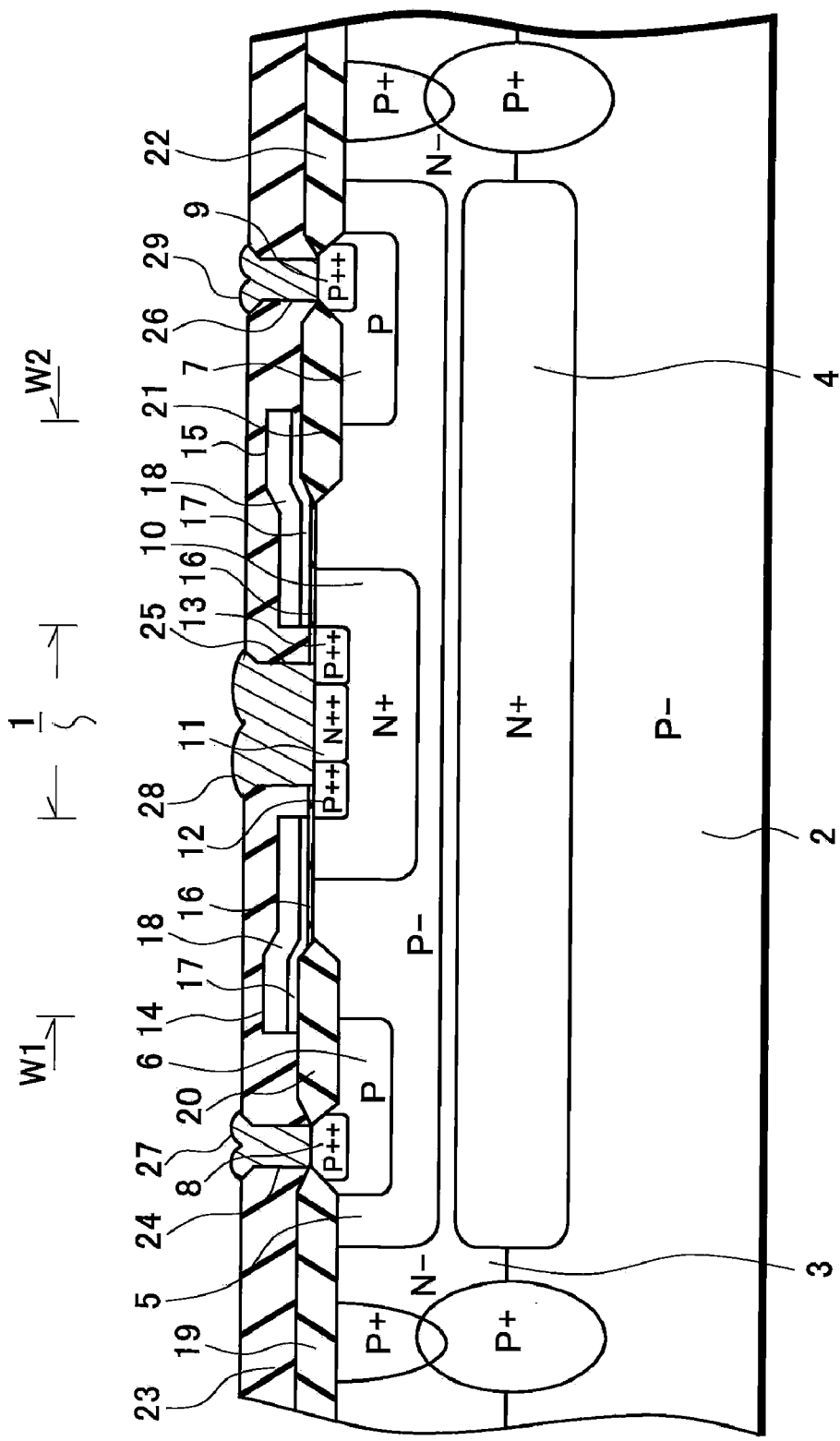
FIG. 1 is a cross-sectional view for describing a semiconductor device according to a preferred embodiment of the present invention.
Figure 2:
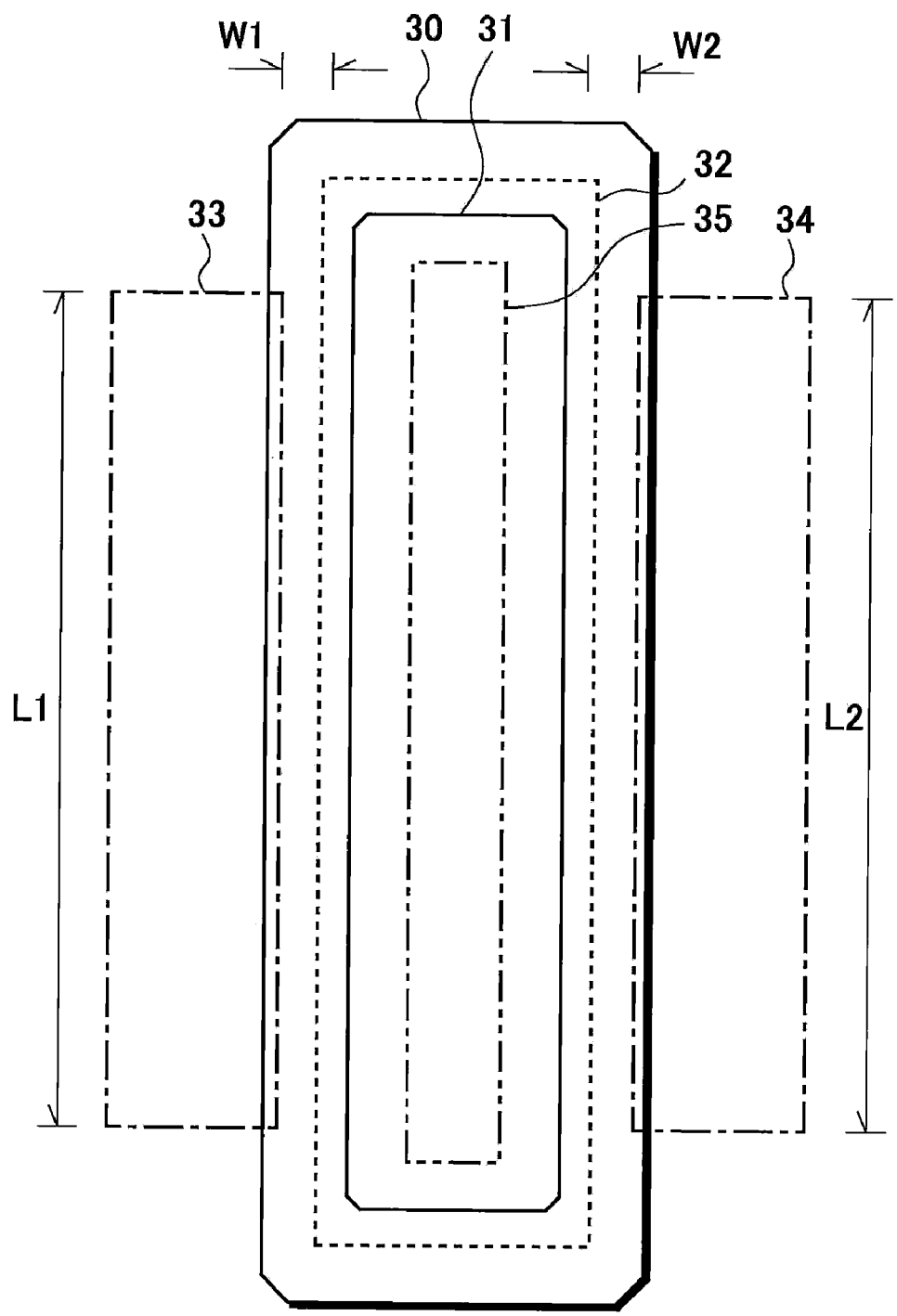
FIG. 2 is a plan view for describing the semiconductor device according to the preferred embodiment of the present invention.

Hereinafter, descriptions will be given in detail of a semiconductor device according to a preferred embodiment of the present invention with reference to FIGS. 1 and 2. FIG. 1 is a cross-sectional view for describing the semiconductor device according to this embodiment. FIG. 2 is a plan view for describing the semiconductor device according to this embodiment.

As shown in FIG. 1, a P-channel MOS transistor 1 mainly includes a P type single crystal silicon substrate 2, an N type epitaxial layer 3, an N type buried diffusion layer 4, a P type diffusion layer 5, P type diffusion layers 6, 7, 8 and 9, which are used as drain regions, N type diffusion layers 10 and 11, which are used as back gate regions, P type diffusion layers 12 and 13, which are used as source regions, and gate electrodes 14 and 15.

The N type epitaxial layer 3 is formed on the P type single crystal silicon substrate 2. Note that, although only one epitaxial layer 3 is formed on the substrate 2 in this embodiment, the preferred embodiment of the present invention is not limited to this case. For example, a plurality of epitaxial layers can be stacked on the substrate.

The N type buried diffusion layer 4 is formed so as to extend in both regions of the substrate 2 and the epitaxial layer 3. As illustrated in FIG. 1, the N type buried diffusion layer 4 is formed across a region where the P-channel MOS transistor 1 is formed.

The P type diffusion layer 5 is formed in the epitaxial layer 3. As shown in FIG. 1, the P type diffusion layer 5 is formed across the region where the P-channel MOS transistor 1 is formed.

The P type diffusion layers 6 and 7 are formed in a manner of overlapping the P type diffusion layer 5. The P type diffusion layer 8 is formed in the P type diffusion layer 6 in a manner of overlapping the P type diffusion layer 6. The P type diffusion layer 9 is formed in the P type diffusion layer 7 in a manner of overlapping the P type diffusion layer 7. With this structure, the P type diffusion layers 5, 6, 7, 8 and 9 are used as the drain regions. Incidentally, the P type diffusion layers 6 and 7 may be circularly formed around the N type diffusion layer 10. Moreover, the P type diffusion layers 8 and 9 may be circularly formed around the N type diffusion layer 10.

The N type diffusion layer 10 is formed in the P type diffusion layer 5 in a manner of overlapping the P type diffusion layer 5. The N type diffusion layer 11 is formed in the N type diffusion layer 10 in a manner of overlapping the N type diffusion layer 10. The N type diffusion layer 10 is used as the back gate region while the N type diffusion layer 11 is used as a back gate leading region. In addition, the N type diffusion layer 10 positioned below the gate electrodes 14 and 15 is used as a channel region.

The P type diffusion layers 12 and 13 are formed in the N type diffusion layer 10 in a manner of overlapping the N type diffusion layer 10. The P type diffusion layers 12 and 13 are used as the source regions. The N type diffusion layer 11 and the P type diffusion layers 12 and 13 are connected to a source electrode 28, and are equal in electric potential to that of the source electrode 28. Incidentally, the P type diffusion layers 12 and 13 may be circularly formed around the N type diffusion layer 11.

The gate electrodes 14 and 15 are formed on a gate oxide film 16. Each of the gate electrodes 14 and 15 is formed of, for example, a polysilicon film 17 and a tungsten silicon film 18 so as to have a desired thickness. Incidentally, the gate electrodes 14 and 15 may be circularly formed.

LOCOS (Local Oxidation of Silicon) oxide films 19, 20, 21 and 22 are formed in the epitaxial layer 3 by means of a LOCOS method. The thickness of each flat portion of the LOCOS oxide film 19, 20, 21 and 22 is approximately 3000 Å to 4000 Å, for example. Incidentally, a thermal oxide film having a thickness of, for example, approximately 3000 Å to 4000 Å may be formed by means of a thermal oxidation method in the regions where the LOCOS oxide films 19, 20, 21 and 22 are formed. In the region where each of the LOCOS oxide films 19, 20, 21 and 22 is formed, an insulating film deposited by means of a CVD method may be formed in a groove formed by etching.

An insulating layer 23 is formed over the epitaxial layer 3. The insulating layer 23 is formed of a BPSG (Boron Phospho Silicate Glass) film, a SOG (Spin On Glass) film or the like. In addition, by means of a known photolithography technique, contact holes 24, 25 and 26 are formed in the insulating layer 23 by dry etching using $CHF_3$ or $CF_4$ gas, for example.

In each of the contact holes 24, 25 and 26, an aluminum alloy film made of, for example, an Al—Si film, an Al—Si—Cu film or an Al—Cu film is selectively formed, so that drain electrodes 27 and 29 and the source electrode 28 are formed respectively in the contact holes 24, 26 and 25. Incidentally, the drain electrodes 27 and 29 may be circularly formed around the source electrode 28. In addition, although a layer of wiring to the gate electrodes 14 and 15 is not illustrated in the cross-section shown in FIG. 1, the gate electrodes 14 and 15 are connected to the wiring layer in other regions.

In FIG. 2, a region surrounded by solid lines 30 and 31 indicates the gate electrodes 14 and 15. A region surrounded by a dotted line 32 indicates the N type diffusion layer 10. A region surrounded by a dashed line 33 indicates the P type diffusion layer 6. A region surrounded by a dashed line 34 indicates the P type diffusion layer 7. A region surrounded by the solid line 31 and a chain double-dashed line 35 indicates the P type diffusion layers 12 and 13, and a region surrounded by the chain double-dashed line 35 indicates the N type diffusion layer 11.

As shown in FIG. 2, the P type diffusion layers 6 and 7 as the drain regions are arranged respectively in regions represented by L1 and L2 for the corresponding gate electrodes 14 and 15 which are circularly arranged. The P type diffusion layers 6 and 7 are arranged partially below the gate electrodes 14 and 15, respectively, due to a lateral diffusion at the time of forming the P type diffusion layers 6 and 7. On the other hand, the P type diffusion layers 12 and 13 as the source regions are arranged respectively at substantially the same positions as those of the edge portions of the corresponding gate electrodes 14 and 15, as indicated by the solid line 31. Although detailed descriptions will be given later in the description of a method of manufacturing a semiconductor device, the P type diffusion layers 6 and 7 as the drain regions and the P type diffusion layers 12 and 13 as the source regions are formed by self-alignment using the gate electrodes 14 and 15. At this time, since a thermal diffusion time is short for the P type diffusion layers 12 and 13, the lateral diffusion takes place to a small extent. For this reason, the P type diffusion layers 12 and 13 have the above-described positional relation with the gate electrodes 14 and 15.

In other words, in this embodiment, a separation distance W1 between the P type diffusion layer 6 as the drain region and the P type diffusion layer 12 as the source region is the same as a separation distance W2 between the P type diffusion layer 7 as the drain region and the P type diffusion layer 13 as the source region. Since the P type diffusion layers 6, 7, 12 and 13 are formed by self-alignment using the gate electrodes 14 and 15, it is possible to eliminate the need for taking mask misalignment into consideration. With this structure, it is possible to reduce the device size while keeping the channel length and the on-resistance of the P-channel MOS transistor 1 at appropriate values.

In this embodiment, descriptions have been given of the case where each of the gate electrodes 14 and 15 has a lamination structure of the polysilicon film 17 and the tungsten silicon film 18. However, the preferred embodiment of the present invention is not limited to this case. For example, each of the gate electrodes 14 and 15 may have a single-layer structure of a polysilicon film or a tungsten silicon film, as long as each of the gate electrodes 14 and 15 has a thickness enough to prevent ions of an impurity from penetrating through the gate electrode at the time of an ion implantation process performed for forming the P type diffusion layers 6 and 7. Alternatively, various modifications are possible to be made on the present invention without departing from the spirit of the present invention.

Next, descriptions will be given in detail of a method of manufacturing a semiconductor device according to another embodiment of the present invention with reference to FIGS. 3 to 10. FIGS. 3 to 10 are cross-sectional views for describing the method of manufacturing a semiconductor device according to this embodiment. Incidentally, in FIGS. 3 to 10, descriptions will be given of the method of manufacturing the semiconductor device shown in FIG. 1.

Figure 3:
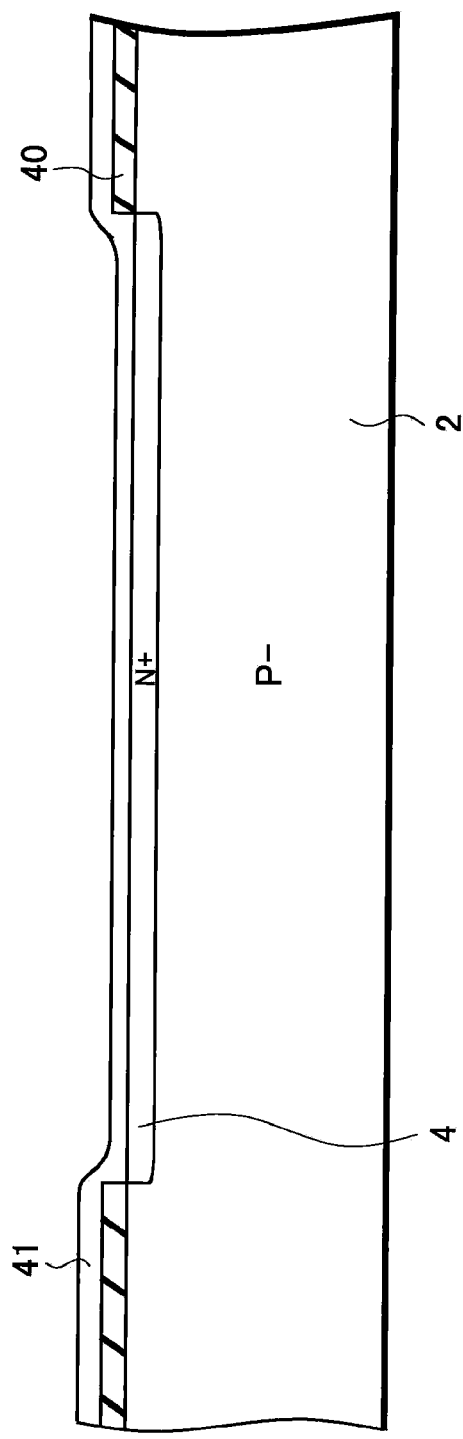
FIG. 3 is a cross-sectional view for describing a method of manufacturing a semiconductor device according to another preferred embodiment of the present invention.

Firstly, as shown in FIG. 3, a P type single crystal silicon substrate 2 is prepared. A silicon oxide film 40 is formed on the substrate 2, and the silicon oxide film 40 is selectively removed, so that an opening is formed in a region where an N type buried diffusion layer 4 is to be formed. Then, by using the silicon oxide film 40 as a mask, a liquid source 41 containing an N type impurity, for example, antimony (Sb) is applied to the surface of the substrate 2 by means of a spin-coating method. Subsequently, the antimony (Sb) is thermally diffused, so that the N type buried diffusion layer 4 is formed. Thereafter, the silicon oxide film 40 and the liquid source 41 are removed.

Figure 4:
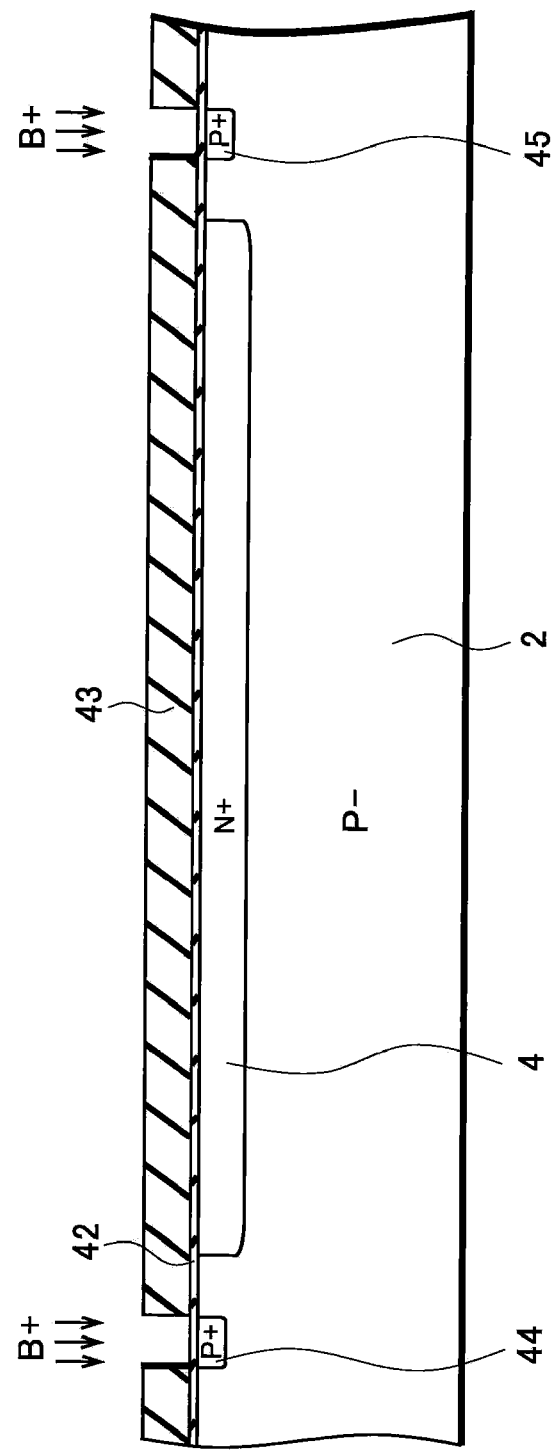
FIG. 4 is a cross-sectional view for describing the method of manufacturing a semiconductor device according to the preferred embodiment of the present invention.

Next, as shown in FIG. 4, a silicon oxide film 42 is formed on the substrate 2, and a photoresist 43 is formed on the silicon oxide film 42. Thereafter, by means of the known photolithography technique, openings are formed in the photoresist 43 on regions where P type buried diffusion layers 44 and 45 are to be formed. Subsequently, ions of a P type impurity, for example, boron (B) are implanted from the surface of the substrate 2 at an accelerating voltage of 40 to 180 (keV) and a dose of $1.0 \times 10^{13}$ to $1.0 \times 10^{16}$ (/cm$^2$). The photoresist 43 is removed, and then the P type buried diffusion layers 44 and 45 are formed by thermal diffusion. After that, the silicon oxide film 42 is removed.

Figure 5:
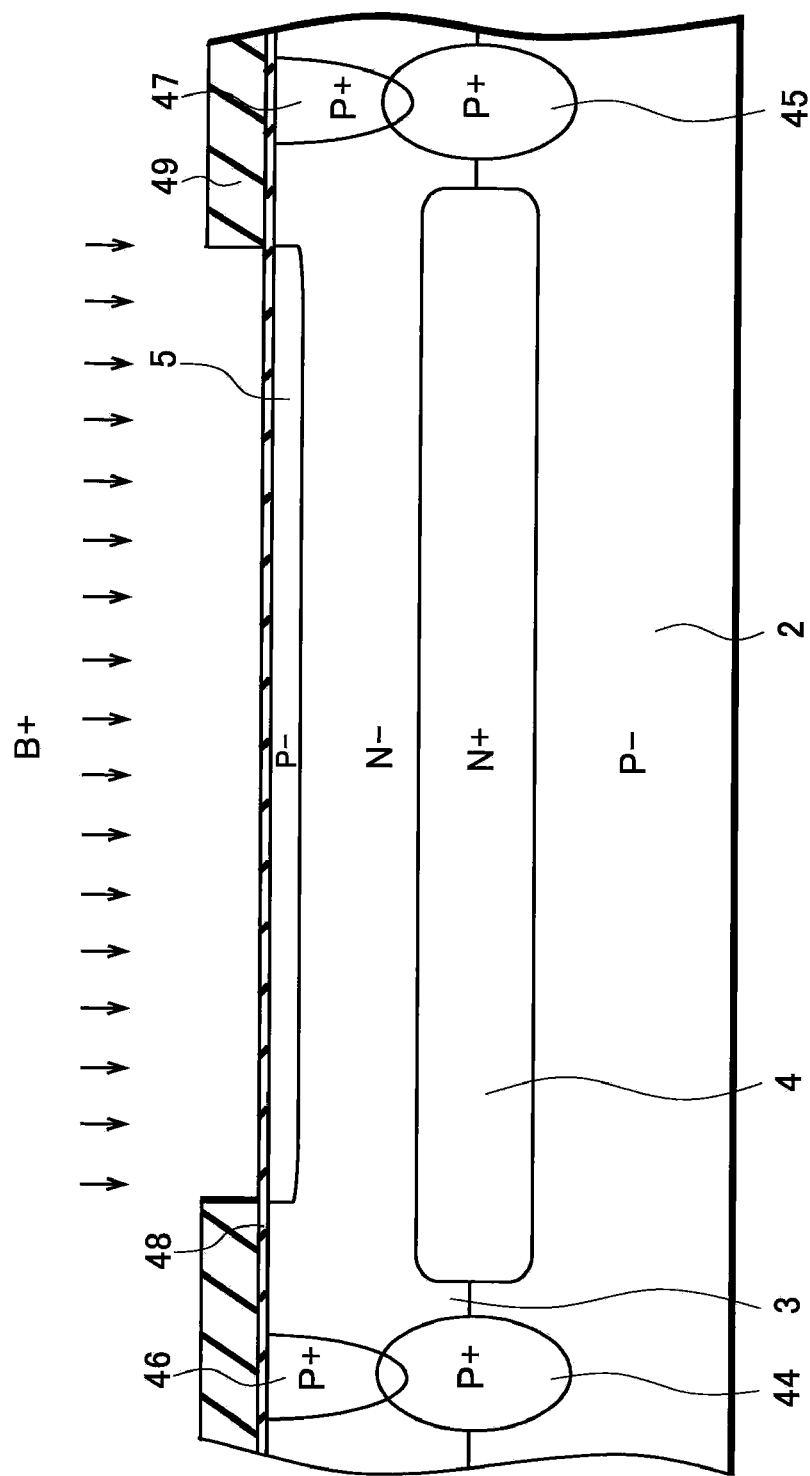
FIG. 5 is a cross-sectional view for describing the method of manufacturing a semiconductor device according to the preferred embodiment of the present invention.

Next, as shown in FIG. 5, the substrate 2 is placed on a susceptor of a vapor phase epitaxial growth apparatus so as to form an N type epitaxial layer 3 on the substrate 2. The vapor phase epitaxial growth apparatus mainly includes a gas supply system, a reactor, an exhaust system and a control system. In this embodiment, by use of a vertical reactor, the thickness uniformity of the epitaxial layer can be improved. The N type impurity in the N type buried diffusion layer 4 and the P type impurity in the P type buried diffusion layers 44 and 45 are thermally diffused by heat treatment in the process of forming the epitaxial layer 3.

Next, by means of the known photolithography technique, P type diffusion layers 46 and 47 are formed in the epitaxial layer 3. Then, a silicon oxide film 48 is formed on the epitaxial layer 3, and a photoresist 49 is formed on the silicon oxide film 48. Thereafter, by means of the known photolithography technique, an opening is formed in the photoresist 49 on a region where a P type diffusion layer 5 is to be formed. Subsequently, ions of a P type impurity, for example, boron (B) are implanted from the surface of the epitaxial layer 3 at an accelerating voltage 40 to 180 (keV) and a dose of $1.0 \times 10^{13}$ to $1.0 \times 10^{16}$ (/cm$^2$). The photoresist 49 is removed, and then the P type diffusion layer 5 is formed by thermal diffusion. After that, the silicon oxide film 48 is removed.

Figure 6:
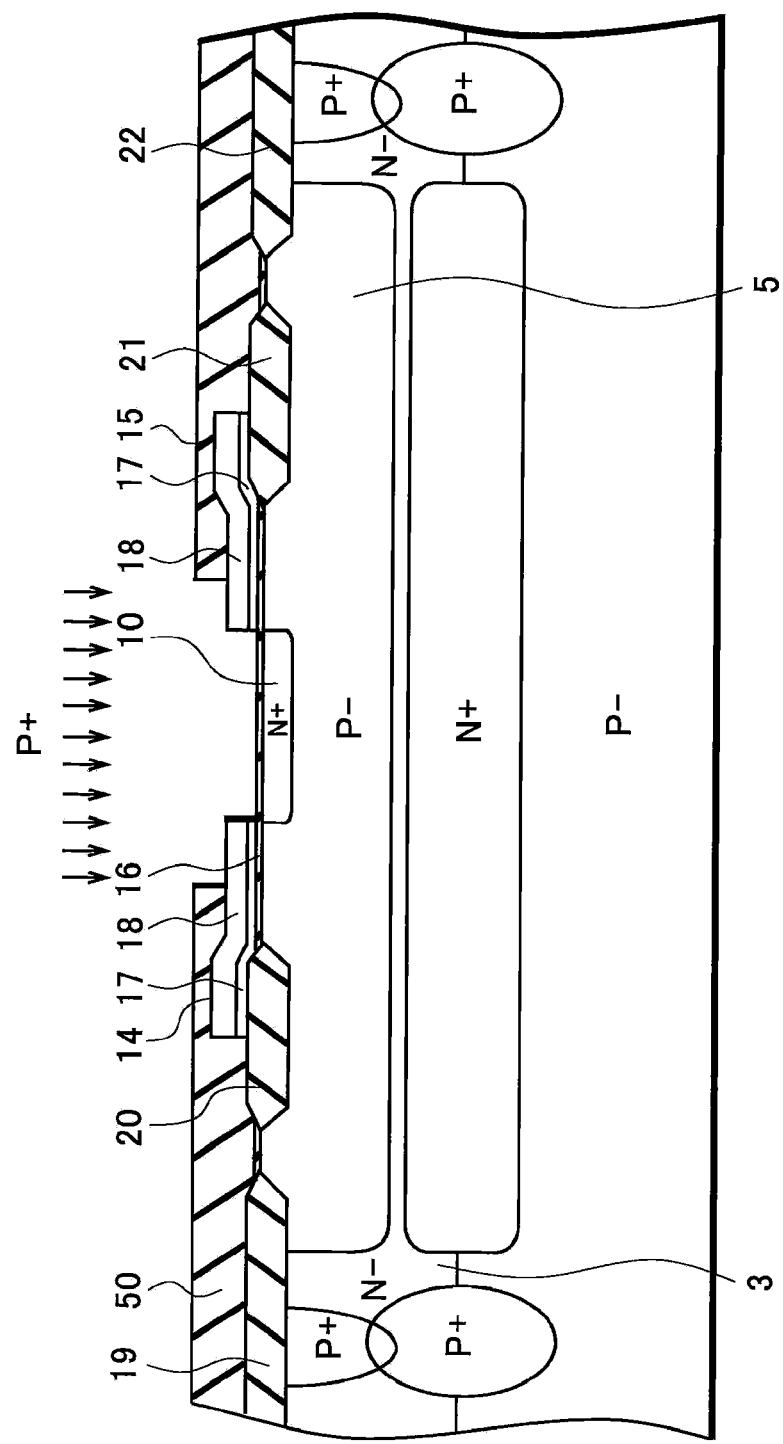
FIG. 6 is a cross-sectional view for describing the method of manufacturing a semiconductor device according to the preferred embodiment of the present invention.

Next, as shown in FIG. 6, LOCOS oxide films 19, 20, 21 and 22 are formed in desired regions of the epitaxial layer 3. A silicon oxide film to be used as a gate oxide film 16 is formed on the epitaxial layer 3 so as to have a thickness of, for example, approximately 100 to 200 (Å). A polysilicon film 17 is formed on the silicon oxide film so as to have a thickness of, for example, approximately 1000 to 2000 (Å), and then a tungsten silicon film 18 is formed on the polysilicon film 17 so as to have a thickness of, for example, approximately 2000 to 3000 (Å). Thereafter, by means of the known photolithography technique, the polysilicon film 17 and the tungsten silicon film 18 are selectively removed to form gate electrodes 14 and 15.

Next, a photoresist 50 is formed on the silicon oxide film to be used as the gate oxide film 16. By means of the known photolithography technique, an opening is formed in the photoresist 50 on a region where an N type diffusion layer 10 is to be formed. Then, ions of an N type impurity, for example, phosphorus (P) are implanted from the surface of the epitaxial layer 3 at an accelerating voltage of 90 to 160 (keV) and a dose of $1.0 \times 10^{14}$ to $1.0 \times 10^{16}$ (/cm$^2$). Subsequently, the photoresist 50 is removed, and then the N type diffusion layer 10 is formed by thermal diffusion.

At this time, the N type diffusion layer 10 is formed by self-alignment using the gate electrodes 14 and 15 as a mask. As described above, since the thickness of the tungsten silicon film 18 is approximately 2000 to 3000 (Å), it is possible to prevent ions of phosphorus (P) from being implanted into regions below the gate electrodes 14 and 15 exposed from the opening in the photoresist 50. In addition, the N type diffusion layer 10 is formed with a high positional accuracy with respect to the gate electrodes 14 and 15.

Figure 7:
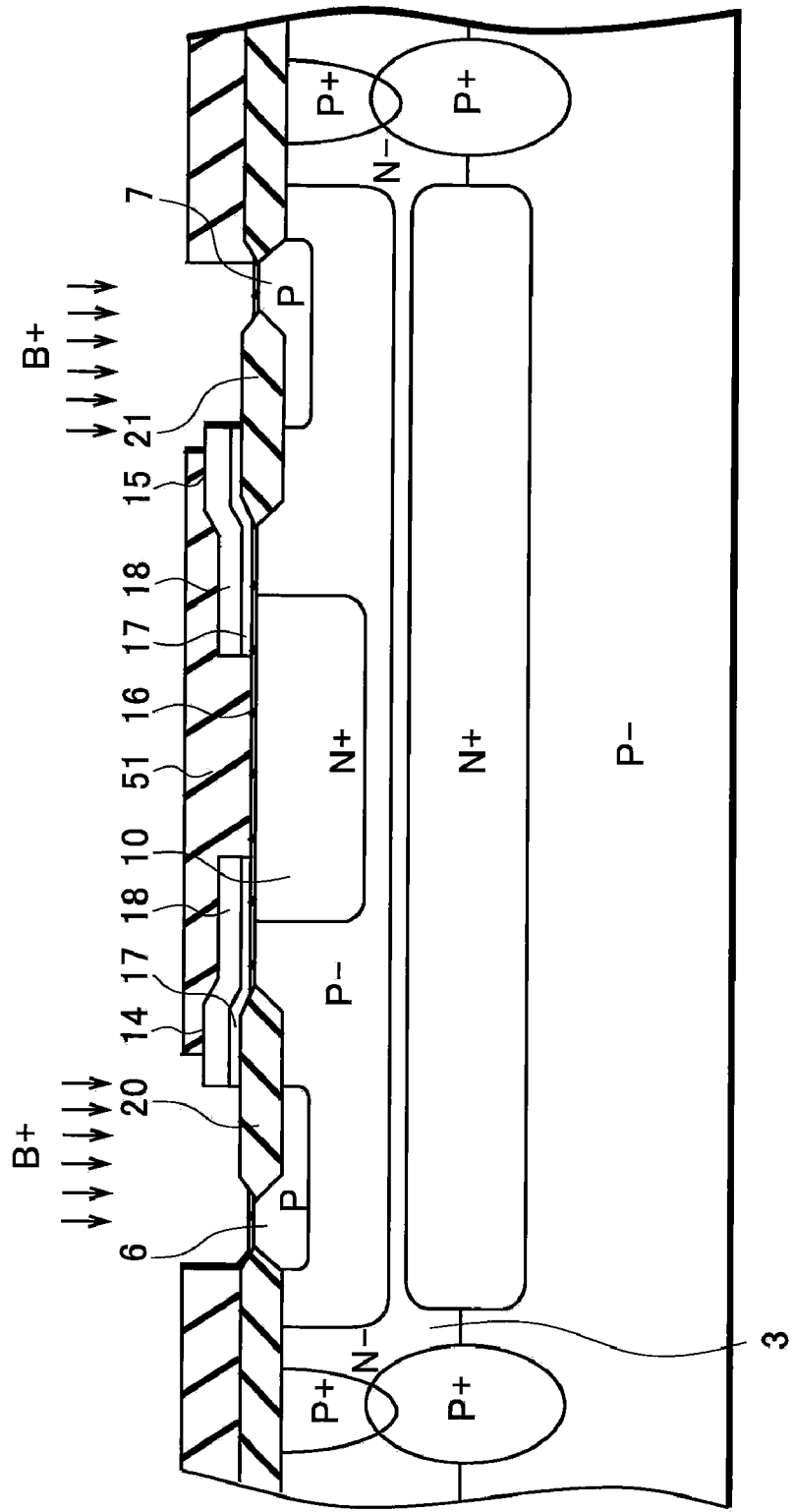
FIG. 7 is a cross-sectional view for describing the method of manufacturing a semiconductor device according to the preferred embodiment of the present invention.

Next, as shown in FIG. 7, a photoresist 51 is formed on the silicon oxide film to be used as the gate oxide film 16. By means of the known photolithography technique, openings are formed in the photoresist 51 on regions where P type diffusion layers 6 and 7 are to be formed. Then, ions of a P type impurity, for example, boron (B) are implanted from the surface of the epitaxial layer 3 at an accelerating voltage of 90 to 160 (keV) and a dose of $1.0 \times 10^{14}$ to $1.0 \times 10^{16}$ (/cm$^2$). Subsequently, the photoresist 51 is removed, and then the P type diffusion layers 6 and 7 are formed by thermal diffusion.

At this time, the P type diffusion layers 6 and 7, which are positioned respectively below the LOCOS oxide films 20 and 21, are formed by self-alignment using the gate electrodes 14 and 15 as a mask. As described above, since the thickness of the tungsten silicon film 18 is approximately 2000 to 3000 (Å), it is possible to prevent ions of boron (B) from being implanted into regions below the gate electrodes 14 and 15 exposed from the openings in the photoresist 51. In addition, the P type diffusion layers 6 and 7 are formed with a high positional accuracy with respect to the gate electrodes 14 and 15.

Specifically, each of the gate electrodes 14 and 15 has a thickness of 4000 Å, and is formed in a structure where the polysilicon film 17 has a thickness of 1500 Å while the tungsten silicon film 18 has a thickness of 2500 Å. In this structure, even when ions of boron (B) are implanted at an accelerating voltage of 160 (keV), the ions of boron (B) are prevented from penetrating through the gate electrodes 14 and 15. In other words, by using, in each of the gate electrodes 14 and 15, the tungsten silicon film 18 through which the ions of boron (B) are unlikely to penetrate, it is possible to form the P type diffusion layers 6 and 7 by self-alignment without increasing the thickness of each of the gate electrodes 14 and 15.

This manufacturing method makes it possible to form the P type diffusion layers 6 and 7 by self-alignment using the gate electrodes 14 and 15 as a mask. As a result, it is not necessary to take account of mask misalignment which occurs in a case where a photoresist is used as a mask, in turn reducing the device size of the MOS transistor. Moreover, as described above, by using the tungsten silicon film 18 in each of the gate electrodes 14 and 15, it is possible to suppress an increase in the thickness of each of the gate electrodes 14 and 15. As a result, it is possible to suppress a level difference in regions of an insulating layer 23 above the gate electrodes 14 and 15, in turn achieving a finer design rule of a wiring layer to be formed above the epitaxial layer 3.

Figure 8:
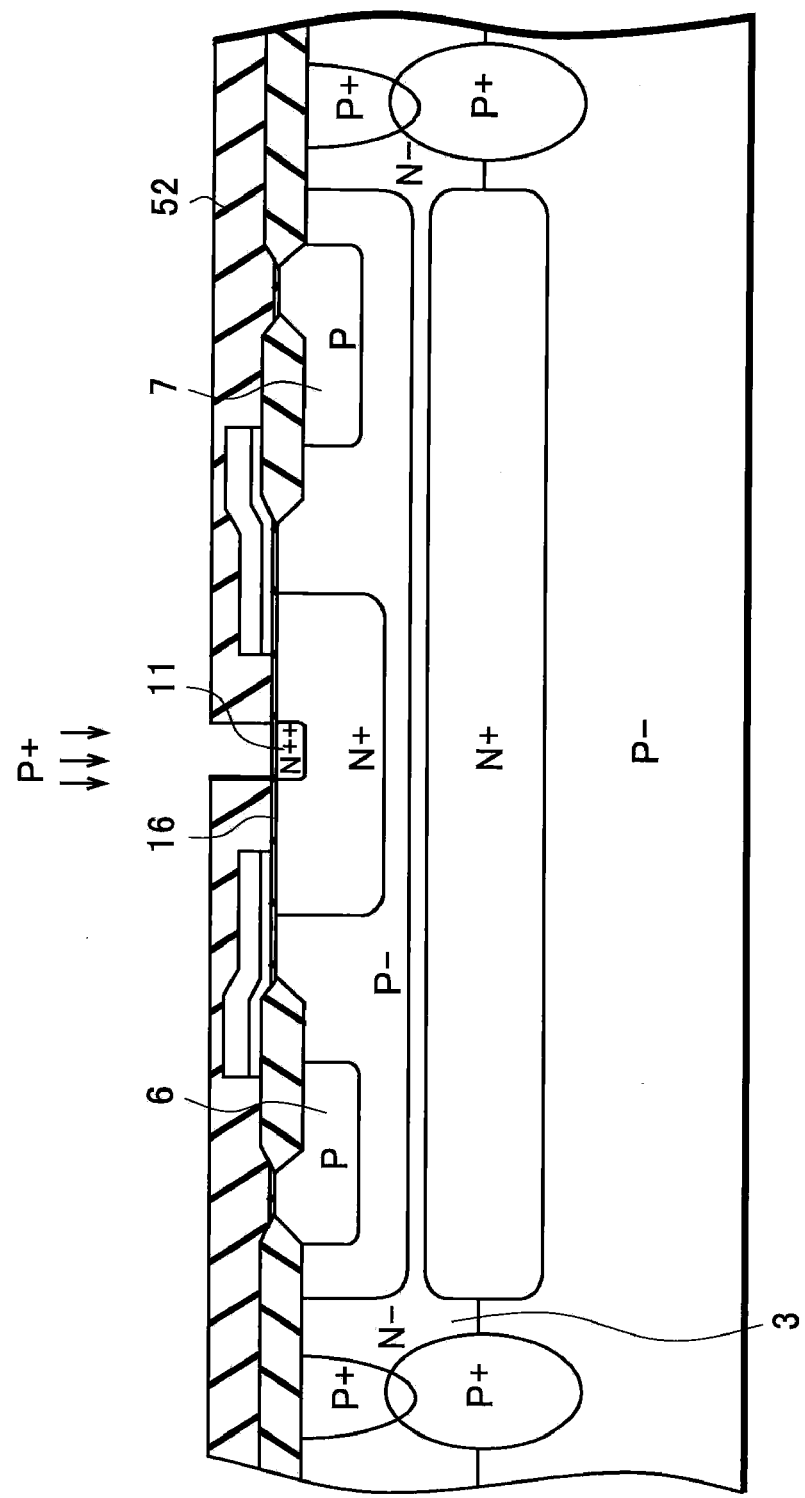
FIG. 8 is a cross-sectional view for describing the method of manufacturing a semiconductor device according to the preferred embodiment of the present invention.

Next, as shown in FIG. 8, a photoresist 52 is formed on the silicon oxide film to be used as the gate oxide film 16. By means of the known photolithography technique, an opening is formed in the photoresist 52 on a region where an N type diffusion layer 11 is to be formed. Then, ions of an N type impurity, for example, phosphorus (P) are implanted from the surface of the epitaxial layer 3 at an accelerating voltage of 90 to 110 (keV) and a dose of $1.0 \times 10^{14}$ to $1.0 \times 10^{16}$ (/cm$^2$). Subsequently, the photoresist 52 is removed, and then the N type diffusion layer 11 is formed by thermal diffusion.

Figure 9:
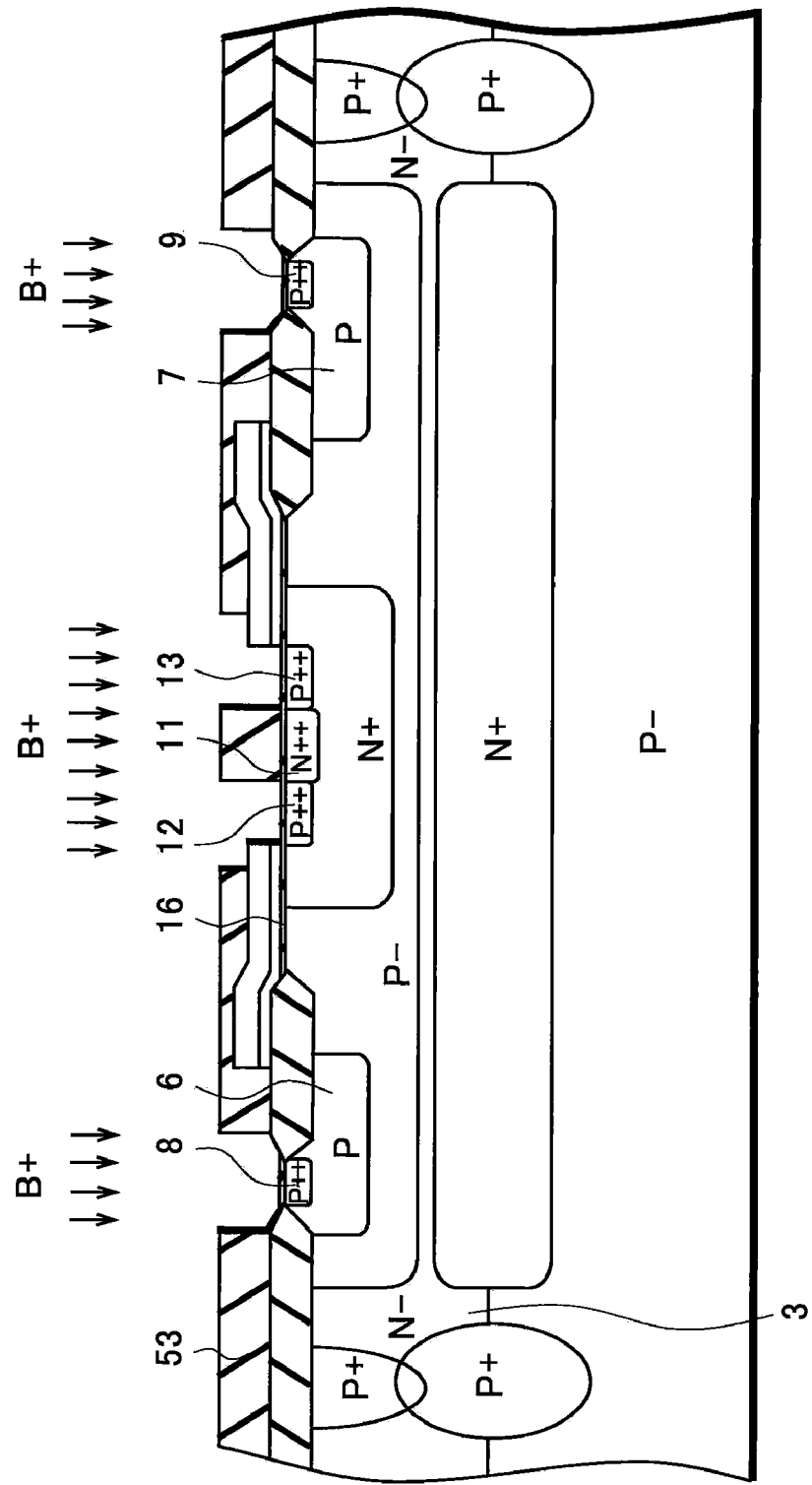
FIG. 9 is a cross-sectional view for describing the method of manufacturing a semiconductor device according to the preferred embodiment of the present invention.

Next, as shown in FIG. 9, a photoresist 53 is formed on the silicon oxide film to be used as the gate oxide film 16. By means of the known photolithography technique, openings are formed in the photoresist 53 on regions where P type diffusion layers 8, 9, 12 and 13 are to be formed. Then, ions of a P type impurity, for example, boron (B) are implanted from the surface of the epitaxial layer 3 at an accelerating voltage of 50 to 70 (keV) and a dose of $1.0 \times 10^{14}$ to $1.0 \times 10^{16}$ (/cm$^2$). Subsequently, the photoresist 53 is removed, and then the P type diffusion layers 8, 9, 12 and 13 are formed by thermal diffusion.

At this time, part of each of the P type diffusion layers 12 and 13, which part is positioned on a side facing a corresponding one of the P type diffusion layers 6 and 7, is formed by self-alignment using the gate electrodes 14 and 15 as a mask. As described above, since the thickness of the tungsten silicon film 18 is approximately 2000 to 3000 (Å), it is possible to prevent ions of boron (B) from being implanted into regions below the gate electrodes 14 and 15 exposed from the openings in the photoresist 53. In addition, the P type diffusion layers 12 and 13 are formed with a high positional accuracy with respect to the gate electrodes 14 and 15.

Figure 10:
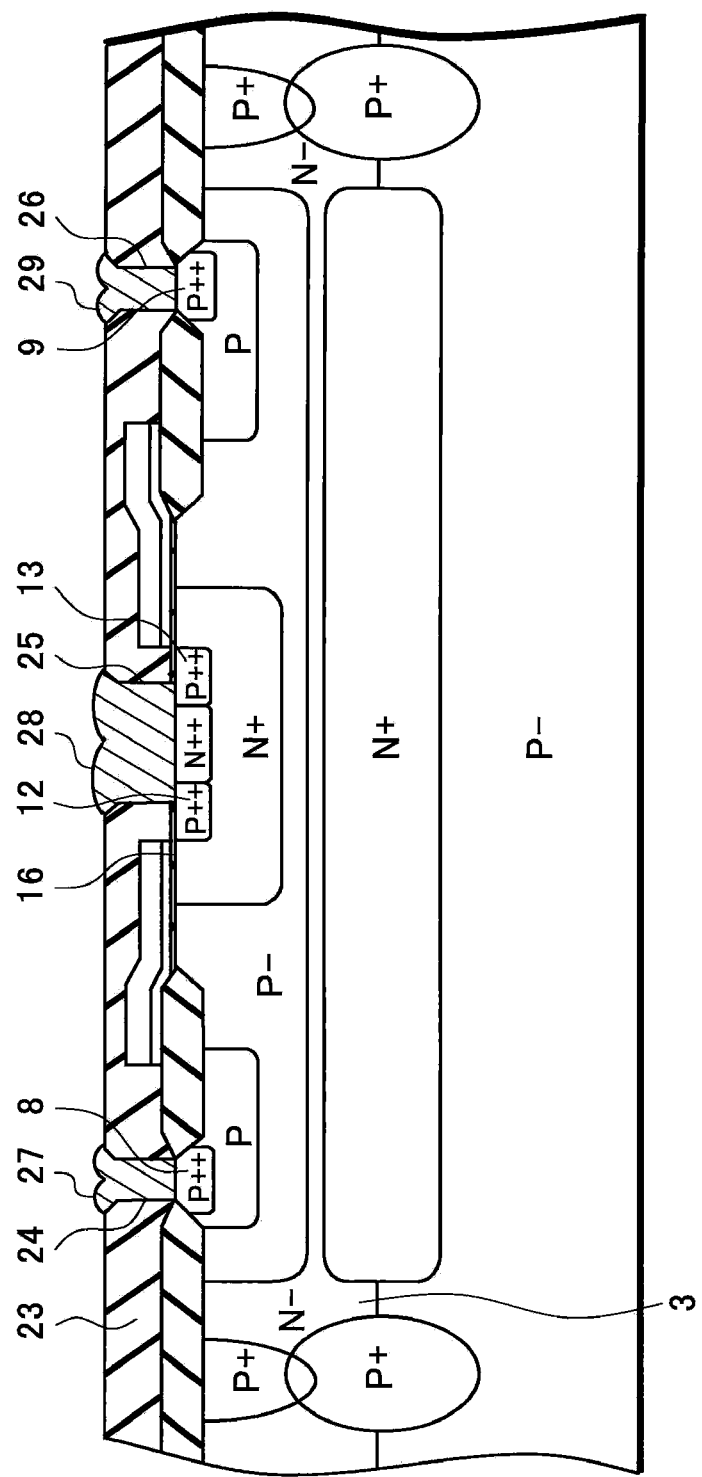
FIG. 10 is a cross-sectional view for describing the method of manufacturing a semiconductor device according to the preferred embodiment of the present invention.

Next, as shown in FIG. 10, for example, a BPSG (Boron Phospho Silicate Glass) film, a SOG (Spin On Glass) film or the like is deposited as the insulating layer 23 over the epitaxial layer 3. Then, by means of the known photolithography technique, contact holes 24, 25 and 26 are formed in the insulating layer 23 by dry etching using CHF$_3$ or CF$_4$ gas, for example. In each of the contact holes 24, 25 and 26, an aluminum alloy film made of, for example, an Al—Si film, an Al—Si—Cu film or an Al—Cu film is selectively formed, so that drain electrodes 27 and 29, and a source electrode 28 are formed respectively in the contact holes 24, 26 and 25.

It should be noted that, in this embodiment, descriptions have been given of the case where each of the gate electrodes 14 and 15 is formed in a two-layer structure of the polysilicon film and the tungsten silicon film, but the preferred embodiment of the present invention is not limited to the above-described case. The gate electrode may be formed in a single-layer structure of a polysilicon film or a tungsten silicon film. In this case, it is only necessary that the polysilicon film or the tungsten silicon film have a thickness enough to prevent implanted ions of phosphorus (P) and boron (B) from penetrating through the film. Moreover, various modifications are possible to be made on the preferred embodiment of the present invention without departing from the spirit of the preferred embodiment of the present invention.

In the preferred embodiment of the present invention, the source region and the drain region are formed in accordance with the region where the gate electrode is formed. This structure makes it possible to reduce the device size of the MOS transistor while keeping the channel length, the on-resistance, and the like of the MOS transistor at appropriate values.

In addition, in the preferred embodiment of the present invention, the tungsten silicon film is used for the gate electrode. This structure makes it possible to suppress the level difference in the insulating layer formed on the region where a LOCOS oxide film and the gate electrode are formed. As a result, a finer design rule of the wiring layer can be achieved.

Moreover, in the preferred embodiment of the present invention, the diffusion layer as the drain region is formed by self-alignment using the gate electrode below a region where the LOCOS oxide film is formed This manufacturing method makes it possible to form the diffusion layer with a high positional accuracy with respect to the gate electrode. As a result, the device size of the MOS transistor can be reduced.

Furthermore, in the preferred embodiment of the present invention, the diffusion layer as the source region is formed by self-alignment using the gate electrode. This manufacturing method makes it possible to form the source region and the drain region with a high positional accuracy with respect to the gate electrode. As a result, the device size of the MOS transistor can be reduced.

Still furthermore, in the preferred embodiment of the present invention, the gate electrode is formed by depositing the tungsten silicon film on the polysilicon film. This manufacturing method makes it possible to suppress the thickness of the gate electrode within a desired range. As a result, a finer design rule for forming the wiring layer can be achieved.

What is claimed is:

1. A semiconductor device comprising:
    a semiconductor layer;
    drain regions, a source region and a back gate region, which are formed in the semiconductor layer;
    a gate oxide film formed on the semiconductor layer; and
    a gate electrode formed on the gate oxide film,
    wherein the drain regions are disposed separately at respective sides of the back gate region, and
    the separation distance between a first one of the drain regions and the source region is the substantially same as the separation distance between a second one of the drain regions and the source region.

2. The semiconductor device according to claim 1, wherein the gate electrode is formed of a polysilicon film and a tungsten silicon film, and
    the tungsten silicon film has a thickness greater than that of the polysilicon film.

3. The semiconductor device according to claim 1, wherein a thermal oxide film is formed in the semiconductor layer, and the thermal oxide film is a LOCOS oxide film formed by means of a LOCOS method.

* * * * *